US011982699B2

(12) United States Patent
Obermaier et al.

(10) Patent No.: US 11,982,699 B2
(45) Date of Patent: May 14, 2024

(54) OVER-THE-AIR TESTING OF MILLIMETER WAVE ANTENNA RECEIVER ARRAYS

(71) Applicant: NATIONAL INSTRUMENTS CORPORATION, Austin, TX (US)

(72) Inventors: Martin Obermaier, Dresden (DE); Martin Laabs, Dresden (DE); Dirk Plettemeier, Dresden (DE); Marc Vanden Bossche, Bornem (BE); Thomas Deckert, Dresden (DE); Vincent Kotzsch, Dresden (DE); Johannes Dietmar Herbert Lange, Dresden (DE)

(73) Assignee: National Instruments Corporation, Austin, TX (US)

( * ) Notice: Subject to any disclaimer, the term of this patent is extended or adjusted under 35 U.S.C. 154(b) by 409 days.

(21) Appl. No.: 17/532,532

(22) Filed: Nov. 22, 2021

(65) Prior Publication Data
US 2023/0160936 A1 May 25, 2023

(51) Int. Cl.
*H01Q 21/06* (2006.01)
*G01R 29/08* (2006.01)

(52) U.S. Cl.
CPC ..... *G01R 29/0871* (2013.01); *G01R 29/0814* (2013.01)

(58) Field of Classification Search
CPC ............................ H01Q 21/06; G01R 29/0871
See application file for complete search history.

(56) References Cited

U.S. PATENT DOCUMENTS

| 4,980,636 | A | 12/1990 | Romanofsky et al. |
| 6,191,744 | B1 | 2/2001 | Snow et al. |
| 6,525,657 | B1 | 2/2003 | Wojcik |
| 8,212,572 | B2 | 7/2012 | Webb |
| 8,374,552 | B2 | 2/2013 | Rupp et al. |
| 8,706,044 | B2 | 4/2014 | Chang et al. |

(Continued)

FOREIGN PATENT DOCUMENTS

| CN | 107748298 A | 3/2018 |
| EP | 3264641 A1 | 1/2018 |

OTHER PUBLICATIONS

International Search Report and Written Opinion in International Application No. PCT/US2019/032233, mailed Aug. 20, 2019, 12 pages.

(Continued)

*Primary Examiner* — Awat M Salih
(74) *Attorney, Agent, or Firm* — Kowert, Hood, Munyon, Rankin & Goetzel, P.C.; Jeffrey C. Hood; Luke Langsjoen

(57) ABSTRACT

A system and method for testing devices such as integrated circuits (IC) with integrated antenna arrays configured for wireless signal reception. The method performs a calibration operation on a reference device under test (DUT). During the calibration operation, the DUT receives a series of first signals from a first far-field (FF) location and a series of array transmissions from a second near-field (NF) location using different beamforming settings, and determines therefrom a set of calibration parameters. The calibration parameters may be used by a probe antenna system (PAS) to transmit an array transmission to the DUT from the second NF location to emulate a single probe or multi-probe transmission from the first FF location.

24 Claims, 12 Drawing Sheets

(56) References Cited

U.S. PATENT DOCUMENTS

| | | |
|---|---|---|
| 8,868,021 B1 | 10/2014 | Feldman |
| 8,995,513 B1 | 3/2015 | Sandoval et al. |
| 9,065,609 B2 | 6/2015 | McCoy |
| 9,419,784 B2 | 8/2016 | Vanden Bossche |
| 9,459,295 B2 | 10/2016 | Wertz |
| 9,477,566 B2 | 10/2016 | Baker |
| 9,483,372 B2 | 11/2016 | Baker |
| 9,581,630 B2 | 2/2017 | Verbeyst et al. |
| 9,871,649 B2 | 1/2018 | Chopra et al. |
| 9,917,755 B1 | 3/2018 | Rullmann et al. |
| 10,085,162 B2 | 9/2018 | Foegelle |
| 10,914,782 B2 * | 2/2021 | Barthel ............. G01R 31/2841 |
| 2002/0127971 A1 | 9/2002 | Chen et al. |
| 2005/0283697 A1 | 12/2005 | Kang et al. |
| 2009/0153158 A1 | 6/2009 | Dunn |
| 2012/0212244 A1 * | 8/2012 | Zhao ................. G01R 31/3025 324/750.01 |
| 2012/0293379 A1 | 11/2012 | Nickel et al. |
| 2013/0178203 A1 | 7/2013 | Venkataraman |
| 2014/0161164 A1 | 6/2014 | Emmanuel et al. |
| 2014/0273873 A1 | 9/2014 | Huynh |
| 2014/0370821 A1 * | 12/2014 | Guterman ............. H04W 24/00 455/67.14 |
| 2015/0177277 A1 | 6/2015 | Nickel et al. |
| 2017/0141619 A1 | 5/2017 | Linnartz |
| 2017/0356947 A1 | 12/2017 | Kurimoto et al. |
| 2018/0034566 A1 | 2/2018 | Tankielun et al. |
| 2018/0212695 A1 * | 7/2018 | Kyrolainen ........ H04B 17/3911 |
| 2018/0267096 A1 | 9/2018 | Lindell et al. |
| 2018/0337738 A1 | 11/2018 | Wen et al. |
| 2019/0113556 A1 | 4/2019 | Kao |
| 2019/0353698 A1 | 11/2019 | DaSilva et al. |
| 2020/0028598 A1 | 1/2020 | Jing et al. |

OTHER PUBLICATIONS

Valdes et al., U.S. Appl. No. 16/141,697, titled "Hardware Timed Over-the-Air Antenna Characterization", filed Sep. 25, 2018, 72 pgs.

Valdes et al., U.S. Appl. No. 16/141,733, titled "Correlation of Device-Under-Test Orientations and Radio Frequency Measurements", filed Sep. 25, 2018, 74 pgs.

International Search Report and Written Opinion in International Application No. PCT/US2021/048682, mailed Dec. 7, 2021, 9 pages.

* cited by examiner

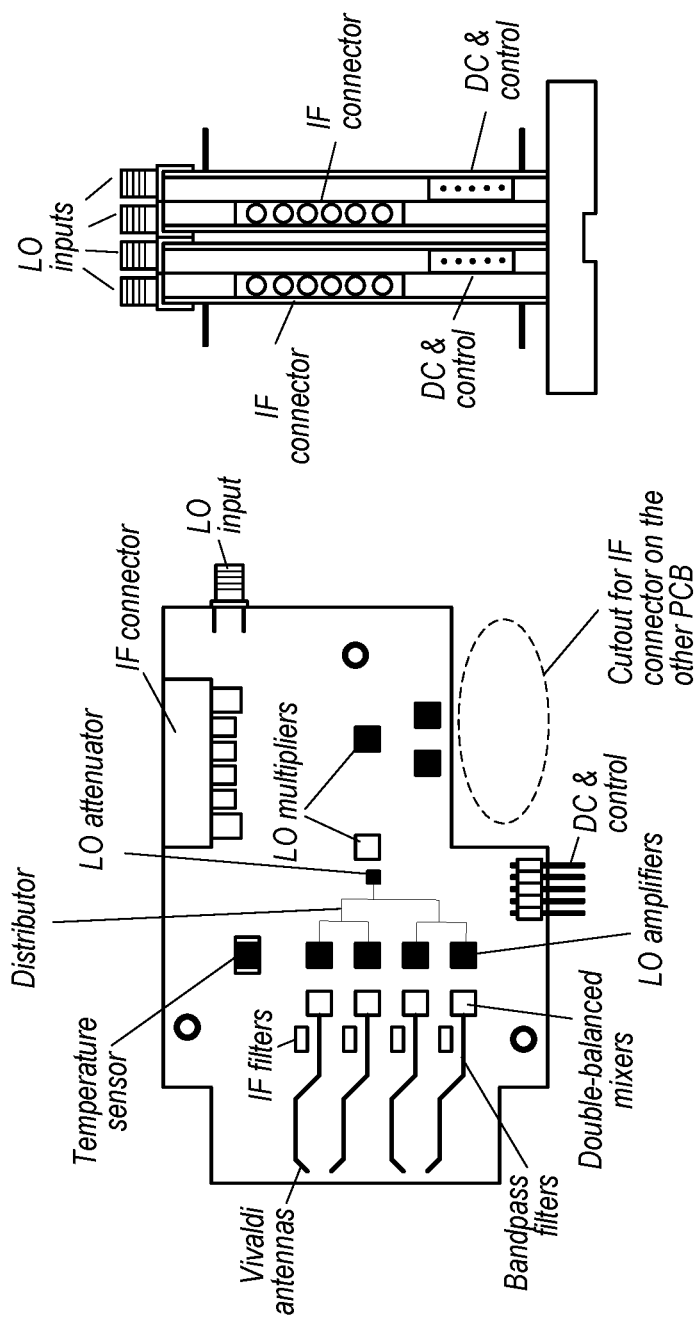
FIG. 8A
FIG. 8B
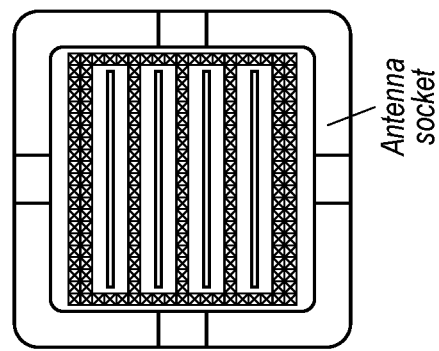
FIG. 8C

OVER-THE-AIR TESTING OF MILLIMETER WAVE ANTENNA RECEIVER ARRAYS

INCORPORATION BY REFERENCE

U.S. patent application Ser. No. 16/168,650, titled "Over-the-Air Testing of Millimeter Wave Integrated Circuits with Integrated Antennas," filed Oct. 23, 2018, whose inventors are DaSilva, et al (US Patent Publication 2019-0353698) is hereby incorporated by reference in its entirety as though fully and completely set forth herein.

FIELD OF THE INVENTION

The present invention relates to the field of semiconductor testing, and more specifically, to testing of millimeter wave integrated circuits with integrated antennas operating in receive mode.

DESCRIPTION OF THE RELATED ART

One key requirement for $5^{th}$ Generation (5G) communications is the support of very high data rates. One option to enable higher data rates is to increase the system bandwidth on the order of 1-2 GHz. Contiguous wide bandwidth is in particular available at higher millimeter wave frequencies such as 24 GHz and above. To overcome the high pathloss at those frequencies, antenna array technology is used to steer the radiated energy to a specific direction.

Thus, as $5^{th}$ generation (5G) wireless technology has become more widespread, beamforming millimeter wave technology has rapidly grown in importance. Current user equipment devices, e.g., cell phones, use integrated circuits with integrated antenna arrays for transmitting and/or receiving millimeter wave signals. These antenna arrays need to be characterized and tested over-the-air (OTA) to determine if they satisfy various regulatory requirements.

In particular, smartphones with millimeter wave support are much more challenging to realize than infrastructure components such as base stations because one has to overcome the high blockage through hands etc. Therefore, multiple antenna-in-package (AiP) modules are needed per device. If one assumes 3-4 AiP modules per premium smartphone, one arrives at test volumes of >200M AiP units per year.

Such antenna arrays are often characterized in anechoic chambers and with a distance R between the probe antenna and the device under test (DUT) to approximate far-field (FF) conditions for the propagation of the electromagnetic waves. One challenge with that testing approach is that the required FF distance R is physically large thus making the size of the anechoic chamber large in turn increasing the cost of testing. The minimum distance R for approximating FF conditions depends on the antenna aperture D and the wavelength $\lambda$ as $$R = 2D^2/\lambda.$$

A bigger antenna aperture obviously leads to a larger far-field distance. For distances less than the far-field distance, the electrical field may not be planar, and measurements may not represent accurately the far-field specifications in the regulatory requirements. Various small anechoic chambers and associated methods exist to reduce the size and cost of the test equipment while still creating FF conditions. However, the potential for such reduction in size and cost is limited.

Large test volumes may benefit from a completely new test approach. OTA testing using small chamber-based approaches would be prohibitively costly. A viable method should combine the capability to test a larger number of devices with the possibility to correlate test results to device validation measurements at a reasonable price.

Present methods for testing the antennas on these integrated circuits are slow, expensive, and/or suffer various drawbacks such that they are unable to economically test a sufficiently large number of antenna arrays. Improvements in the field, in particular, regarding the size, cost, and speed of a test system for automated production testing of modules and devices integrating active antenna arrays, are desired.

SUMMARY OF THE INVENTION

Various embodiments are presented below of a system and method for testing (e.g., rapidly and inexpensively) devices such as integrated circuits (IC) with integrated antennas configured for millimeter wave transmission and/or reception.

The method may first perform a calibration operation on a reference device under test (DUT). The calibration operation may determine a set of calibration parameters. The calibration parameters may be used by a probe antenna system (PAS) to transmit an array transmission to the DUT from a near-field location to emulate a single probe or multi-probe transmission from one or more far-field locations.

Note that the techniques described herein may be implemented in and/or used with a number of different types of DUTs, including but not limited to cellular phones, portable media players, tablet computers, wearable devices, RF semiconductor components, RF power amplifiers, Front End Modules, transceivers, and various other computing devices.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which:

FIGS. 8A-C illustrate an example design for an active PAS setup, according to some embodiments;

Figure 1:
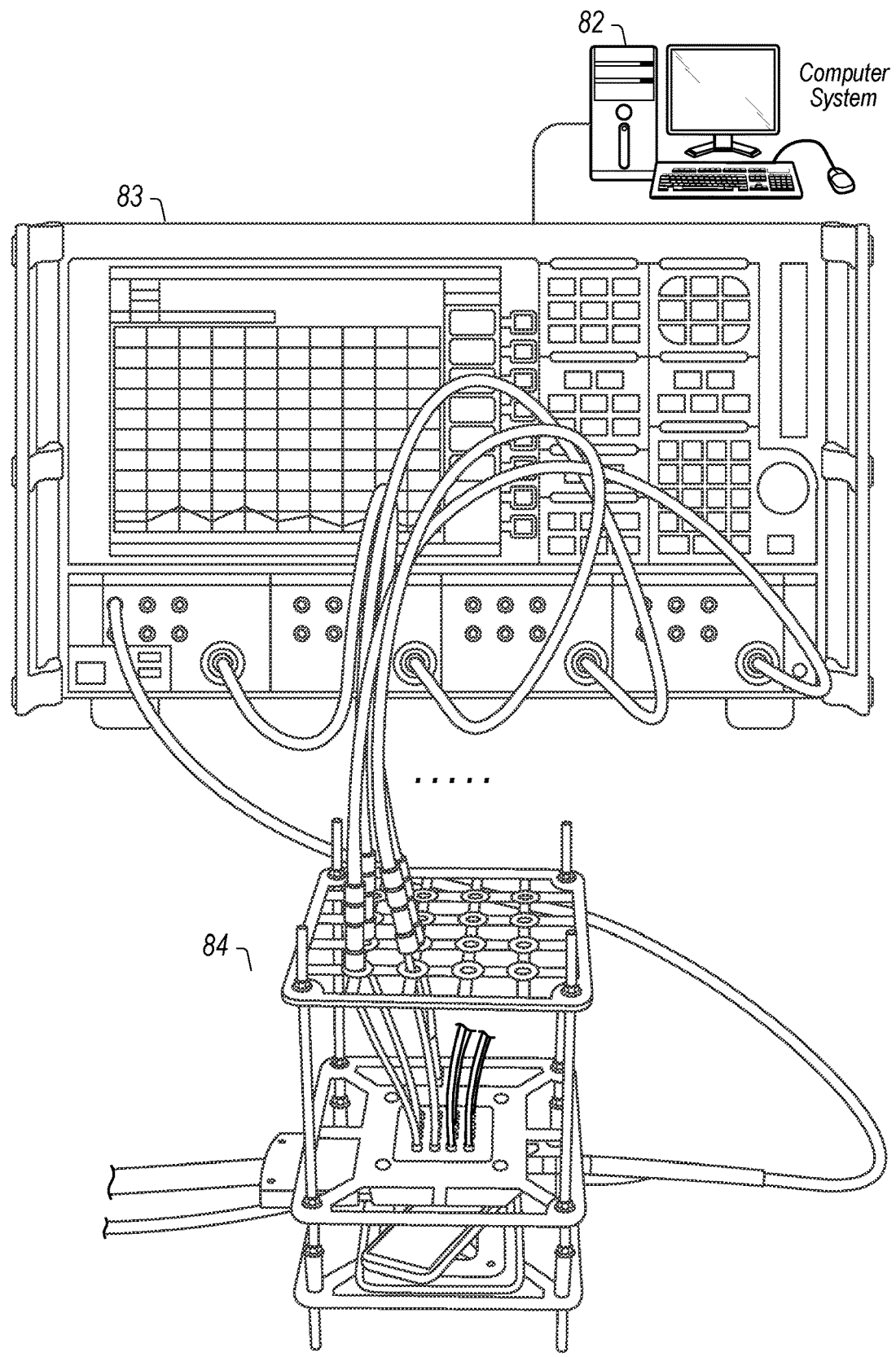
FIG. 1 illustrates an over the air (OTA) testing configuration, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Acronyms

The following is a listing of the acronyms used in the present application:
DUT: Device Under Test
FF: Far-Field
IF: Intermediate Frequency
NF: Near-Field
OTA: Over-the-Air
PAS: Probe Antenna System
RF: Radio Frequency
PCB: Printed Circuit Board
LO: Local Oscillator Terms The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

Far-Field (FF) pattern—a pattern of electromagnetic radiation that exists (or is presumed to exist) in a far field region around an object generating the electromagnetic radiation. An antenna, or a plurality of antenna elements, driven by a signal create electromagnetic fields. In general, the observed amplitude and phase of the electromagnetic fields varies with distance of the observer from the radiating object and with angular direction from the object to the observer. The FF pattern refers to the far field pattern of electromagnetic fields around the antenna (or the object containing the antenna), and references the fact that amplitude and phase of these fields observed at some distance from the radiating object and taken relative to a reference angular direction at the same distance will be independent of distance from the object. Likewise, if an antenna or a plurality of antenna elements is used to receive signals, they respond with varying signal amplitude and phase depending on the distribution of energy in the electromagnetic field around the antenna or plurality of antenna elements. In this case the FF pattern describes for each of a range of angular directions how large the response of the antenna or plurality of antenna elements is for a plane wave of electromagnetic radiation traveling towards the antenna or plurality of antenna elements from that direction and where the amplitude and phase observed at some distance from the radiating object and taken relative to a reference angular direction at the same distance will be independent of the distance from the object. The FF is a well-known electromagnetic concept.

Probe antenna system (PAS)—a plurality of antenna probes and potentially supporting parts modifying the collective properties the antenna probes and parts are presenting to the electromagnetic radiation associated with wireless signals and giving structural integrity to their assembly, and which may be used to measure the wireless signals generated by the DUT or to generate a field of electromagnetic radiation used to measure characteristics of the DUT in receive mode.

Probe-based field measurement of wireless signals—a measurement made with an antenna probe which is part of the PAS. The measurement may comprise determining amplitude and phase of the wireless signals present at the antenna probe. A plurality of probe-based field measurements is the collection of the measurements of all antenna probes belonging to the PAS wherein all these measurements may be made for the same wireless signals present at the PAS. Here "same wireless signals" may refer to the case where the arrangement and configuration of the DUT, the measurement instrumentation, supporting equipment, and ambient environmental conditions are the same for the measurements made with all the antenna probes of the PAS. Different embodiments may choose to make these measurements in various ways and various order, e.g., may perform the measurements on all antenna probes simultaneously or in successive order. A series of a plurality of probe-based field measurements corresponds to multiple of the plurality of probe-based field measurements wherein each one may be made for different wireless signals present at the PAS.

DUT-based field measurement of wireless signals—a measurement made with an antenna or antenna array which is part of the DUT. The measurement may comprise determining amplitude and phase of the wireless signals present at the antenna/antenna array. The wireless signals may be generated by a PAS or another device while the DUT is in receive mode. Here "same wireless signals" may refer to the case where the arrangement and configuration of the PAS and/or DUT, the measurement instrumentation, supporting equipment, and ambient environmental conditions are the same for the measurements made with all the antennas of the DUT. Different embodiments may choose to make these measurements in various ways and various order, e.g., may perform the measurements on all antennas simultaneously or in successive order. A series of a plurality of DUT-based field measurements corresponds to multiple of the plurality of DUT-based field measurements wherein each one may be made for different wireless signals present at the DUT.

FIG. 1—OTA Testing System

FIG. 1 illustrates an over the air (OTA) testing system configured to implement embodiments of the techniques disclosed herein, according to some embodiments. Embodiments of a method for OTA testing (e.g., for production testing of integrated circuits) operating in a receive mode are described below. The system and method for OTA testing may utilize a near-field-to-far-field (NF-to-FF) reconstruction technique as described herein.

Note that various embodiments of the techniques disclosed herein may be implemented in a variety of different ways. For example, the methods described herein may be performed by software executing on a computer system. However, while some embodiments are described in terms of one or more programs executing on a computer, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

As shown in FIG. 1, the OTA test system may include a computer system 82 which couples to a testing apparatus 84. In FIG. 1 the computer system is shown as being a stand-alone computer system separate from the measurement chassis 83. The measurement chassis may in turn be coupled to a testing apparatus 84. Alternatively, the computer may be implemented in the measurement chassis 83. For example, the computer may be implemented as a board or module inserted into a PXI (PCI eXtensions for Instrumentation) chassis form factor. Any of various types of computer system and/or chassis configuration may be used.

Figure 2:
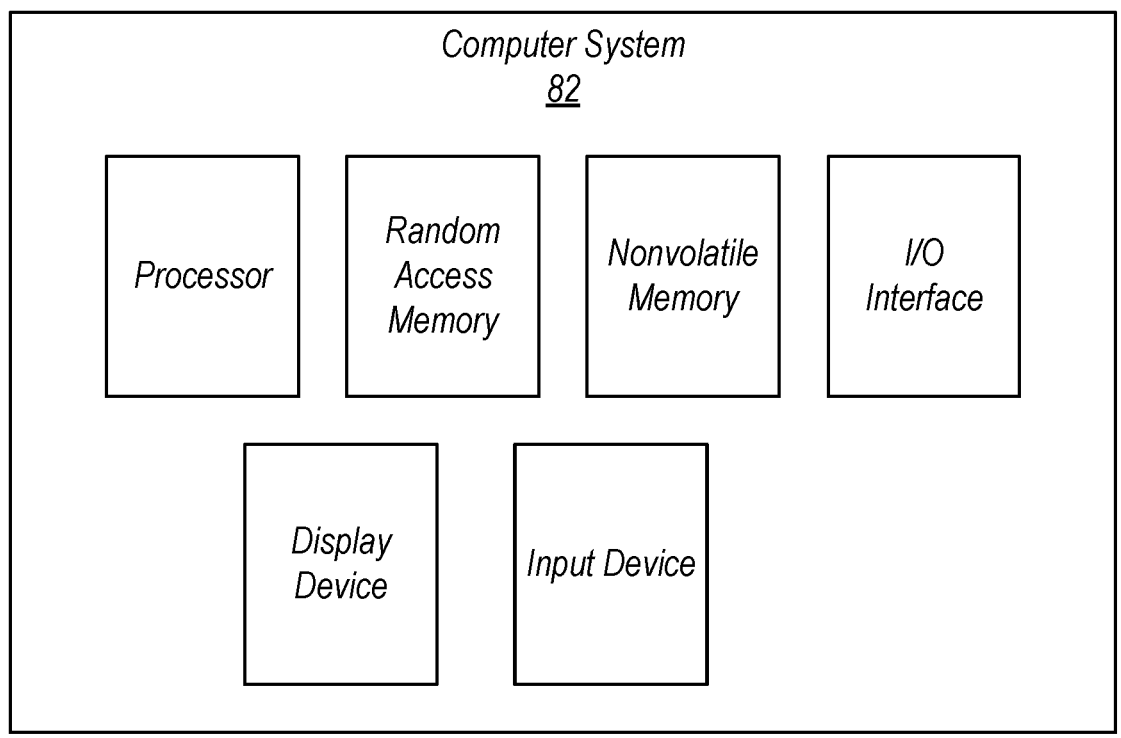
FIG. 2 shows a basic computer system block diagram, according to some embodiments.

As shown in FIG. 2, the computer system 82 may include a processor, random access memory (RAM), nonvolatile memory, a display device, an input device and an I/O interface for coupling to the testing apparatus 84. For example, the computer system 82 may include at least one memory medium on which one or more computer programs or software components according to one embodiment of the present invention may be stored. For example, the memory medium may store one or more programs that are executable to perform the methods described herein. The memory medium may also store operating system software, as well as other software for operation of the computer system. Various embodiments further include receiving or storing instructions and/or data implemented in accordance with the foregoing description upon a carrier medium.

The testing apparatus 84 may comprise a structure designed to receive a device under test (DUT). The DUT may be an antenna array chip, e.g., a chip which comprises a plurality of antennas, each antenna for generating electromagnetic radiation. The DUT may also be a user equipment, such as a cell phone, or other chip or device that has one or more antennas. The testing apparatus may also comprise a PAS designed to be placed proximate to the DUT for measuring electromagnetic signals produced by and/or transmitting electromagnetic signals to the plurality of antennas of the DUT. These transmitted electromagnetic signals are preferably not far-field signal transmissions, and in some embodiments are near field (NF) transmissions. The computer system 82 may be coupled to provide one or more stimulus signals to the PAS to selectively cause the various antennas to produce electromagnetic radiation. The DUT may be configured to receive and measure the NF electromagnetic signals produced by the antennas of the PAS and may provide these measured NF electromagnetic signals to the computer system 82 for processing.

In the embodiment shown in FIG. 1, for ease of illustration, only a subset of the DUTs in the testing apparatus 84 are shown as being coupled to the measurement chassis (only a subset of the total number of wires between the testing apparatus 84 and the chassis 83 are shown). However, it is noted that in a typical system all of the antennas in the DUT of the testing apparatus 84 would be coupled to the measurement chassis 83.

The computer system 82 may perform a novel FF emulation method described herein to calculate NF-to-FF emulation coefficients in a calibration step. The novel NF-to-FF emulation coefficient method is described further below.

FIG. 2—Computer System Block Diagram

FIG. 2 illustrates a simplified block diagram of the computer system 82. As shown, the computer system 82 may comprise a processor that is coupled to a random access memory (RAM) and a nonvolatile memory. The computer system 82 may also comprise an input device for receiving user input and a display device for presenting output. The computer 82 may also comprise an Input/Output (I/O) interface that is coupled to the testing apparatus 84. The I/O interface may be configured to supply signals to the PAS to selectively stimulate the antennas on the PAS to generate electromagnetic radiation for transmission to the DUT. The I/O interface may further be coupled to the DUT and configured to receive electromagnetic signals measured by the DUT.

Figure 4:
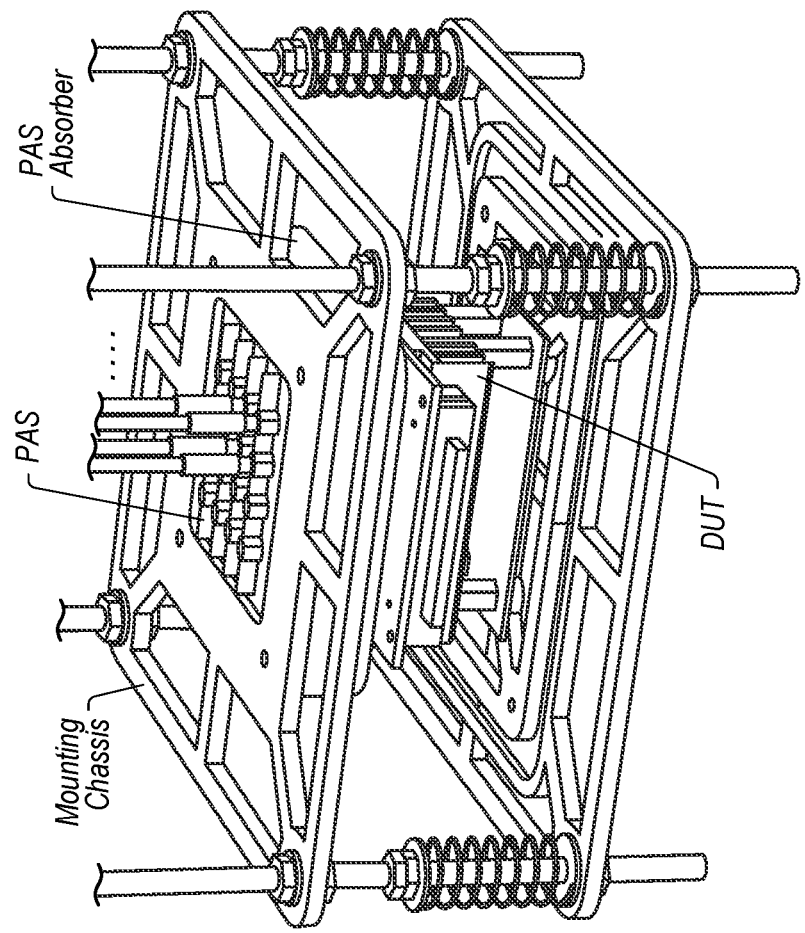
FIGS. 3-4 show examples of a testing apparatus which may support or house a device under test (DUT) and which may also include a probe antenna system (PAS) for measuring electromagnetic signals from the DUT, according to some embodiments.
Figure 3:
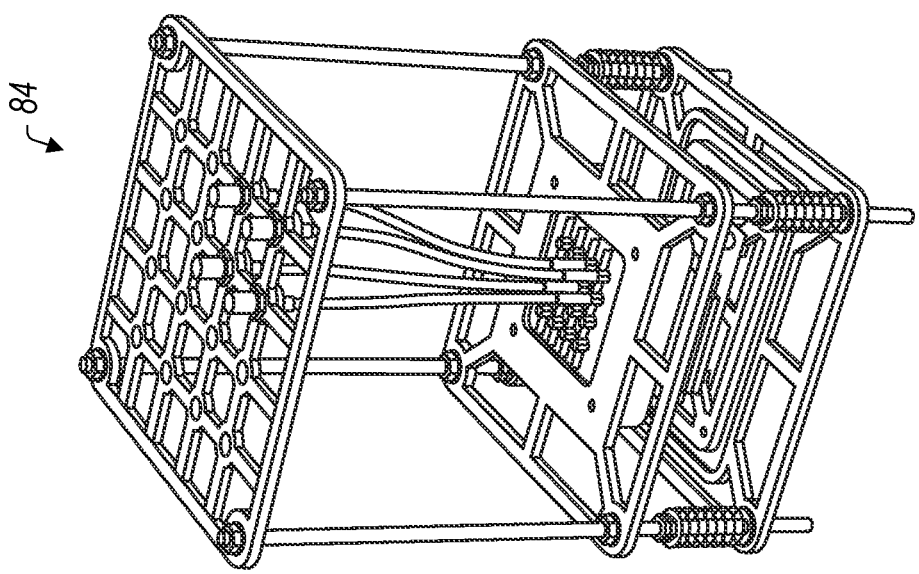

FIGS. 3-4: Testing Apparatus

FIG. 3 shows an embodiment of the testing apparatus 84, and FIG. 4 illustrates the embodiment of FIG. 3 in greater detail. As noted above in FIG. 1, for ease of illustration only a subset or portion of the wires are shown as being connected to the DUT in FIGS. 3 and 4. As shown in FIG. 3, the testing apparatus 84 may comprise a mounting chassis which is configured to support or hold a PAS array for transmitting near field electromagnetic signals to a DUT. The testing apparatus 84 may also comprise an absorber positioned around the PAS and/or the DUT for absorbing undesired electromagnetic signals during the electromagnetic radiation measurements.

As shown in FIG. 4, the mounting chassis is also configured to support or hold a DUT underneath and proximate to the PAS. The testing apparatus 84 may also comprise a first connector coupled to the DUT and also coupled to the computer system 82 for enabling the computer system to provide stimulus signals to the PAS, thereby causing the antenna on the PAS to generate electromagnetic signals. The testing apparatus 84 may also comprise a second connector coupled to the DUT and also coupled to the computer system 82 for enabling the computer system to receive the electromagnetic signals measured by the DUT.

Figure 5:
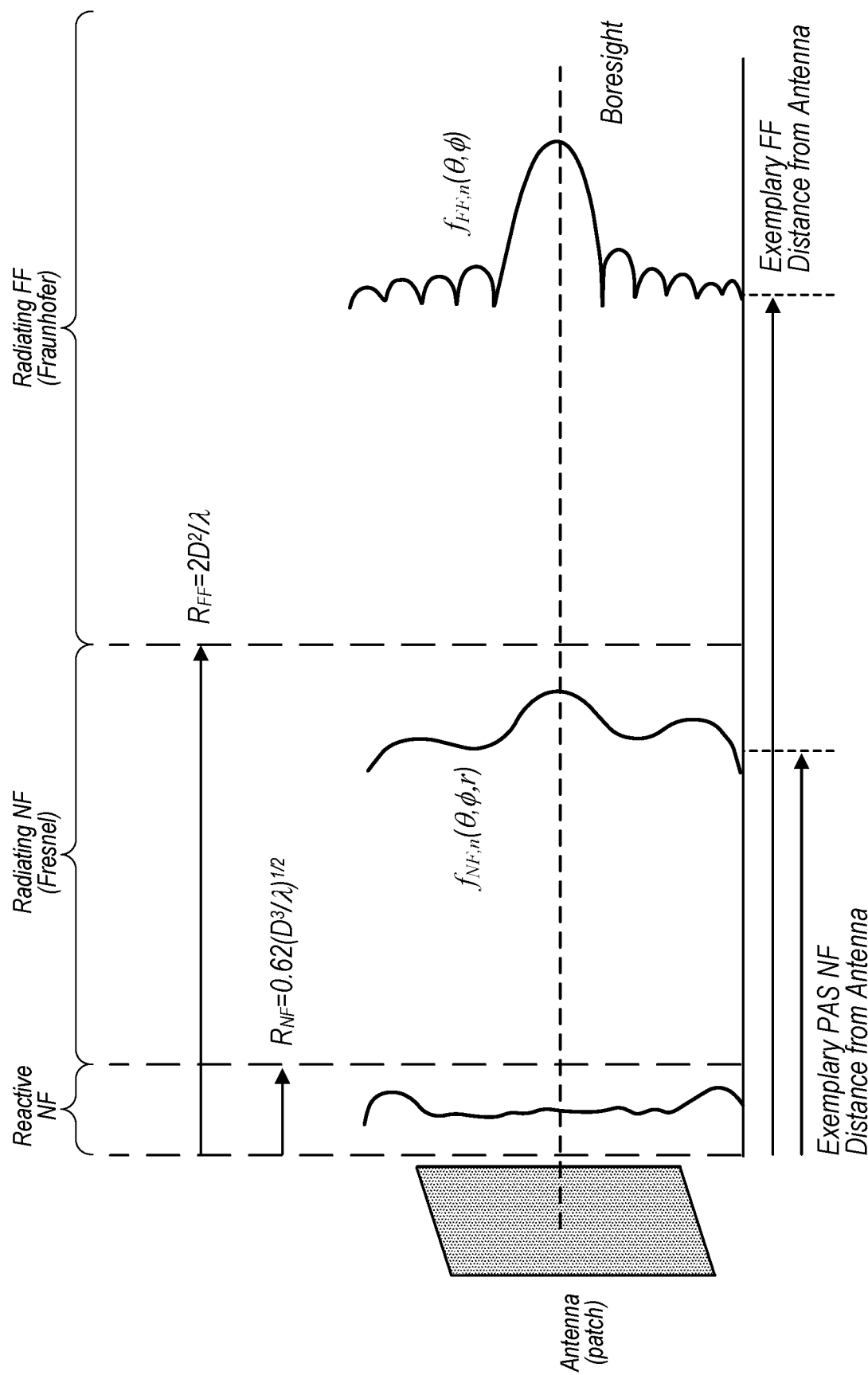
FIG. 5 illustrates field definitions related to wavelength and aperture size, according to some embodiments.

FIG. 5—Field Definitions

FIG. 5 illustrates various field definitions. There are two main distances that play an important role for OTA measurements. First the distance $R_{NF}$ where the reactive NF goes into the radiating NF as well as the distance $R_{FF}$ where the radiating NF goes into the (radiating) FF. For common OTA measurements $R_{FF}$ is most relevant because this is the distance that one can usually assume between a base station and a user terminal. Both distances depend on the antenna aperture size D and wavelength λ and represent approximations. Details on how these borders are defined can be found, e.g., in the book from C. A. Balanis titled "*Antenna Theory—Analysis and Design*". The field definitions are summarized for a scenario where the DUT is the source of electromagnetic radiation (the DUT transmits electromagnetic energy associated with a signal) and a probe antenna or a plurality of probe antennas respond to that radiation, i.e., pick up energy from the corresponding electromagnetic field (these antennas receive electromagnetic energy associated with a signal). The below statements also hold for the case where the DUT receives and the probe antenna or plurality of probe antennas transmits.

If one assumes a millimeter wave antenna at 28 GHz ($\lambda=c/f_C=(3^8$ m/s$)/(28^9$ 1/s$)=0.0107$ m) one could obtain the following NF and FF distances:

$$D=\lambda/2\approx 5.3 \text{ mm}\rightarrow R_{NF}=2.3 \text{ mm}; R_{FF}=5.3 \text{ mm} \quad 1)$$

$$D=10\lambda/2\approx 5.3 \text{ cm}\rightarrow R_{NF}=7.4 \text{ cm}; R_{FF}=53 \text{ cm} \quad 2)$$

One immediately sees that there is a significant difference whether to look at a single element antenna that is represented by example (1) or an antenna array that is represented by example (2).

In the FF, the electromagnetic field almost entirely comprises components that make the direction of power flux pointing strictly away from the source of radiation (e.g., a DUT's antenna), i.e., the field may be composed of radiating components only. One consequence of this is that the shape of the distribution of field strength both, in amplitude and phase, over space may be practically independent of the distance between the source of radiation and the observer. In other words, the distributions measured for two different distances in the FF may be (approximately) equal if normalized, e.g., to their individual peak values; the actual scaling of the non-normalized distributions may still depend on the distance. The shape of this distribution of field strength is often referred to as the FF pattern of the source antenna and is an important characteristic of a radiating DUT. If the probe antenna may be placed in the FF of the DUT then the DUT's FF pattern may be measured directly with the probe by repositioning the DUT and/or probe relatively to each other to a plurality of points on a sphere around the DUT.

In the NF, the closer the observer gets to the radiating source, the more the electromagnetic field will be impacted by reactive components such that more significant portions of power go back and forth between the radiating source and points in its NF. This results in the distribution of field strength both, in amplitude and in phase, over space being dependent on the distance between source and observer in both, absolute value and shape. This also means that, in general, a probe antenna in the NF of the DUT/PAS antenna may be coupled to the DUT/PAS antenna and its presence may alter the properties of the electromagnetic fields radiating from the DUT/PAS.

OTA measurements in the radiating NF are possible with low coupling between the probe and DUT antenna, i.e., the presence of the probe antenna does not alter significantly the properties of the electromagnetic fields radiating from the DUT (this is different in the reactive NF where there is more coupling and the probe antenna does alter the DUT's radiation properties). Still, the shape of the distribution of field strength may still depend on the distance to the antenna.

However, one can use the classical NF-FF transformation known from literature to obtain the FF data. The drawback in this technique is that in particular for antenna arrays one has to spatially sample the field in the order of $\lambda/2$ down to $\lambda/10$ distances to obtain all of the necessary information to apply the NF-FF transformation. Furthermore, the classical NF-FF transformation is computationally complex.

As used herein, the unqualified term "near field" (NF) encompasses both the reactive and the radiating NF.

PAS Design

Figure 6:
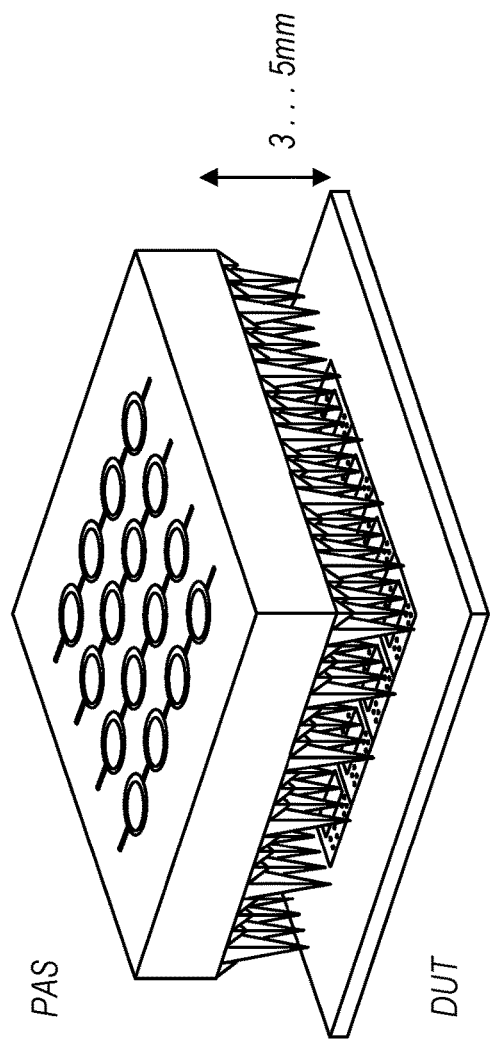
FIG. 6 shows the PAS interfacing with the DUT, according to some embodiments.
Figure 7:
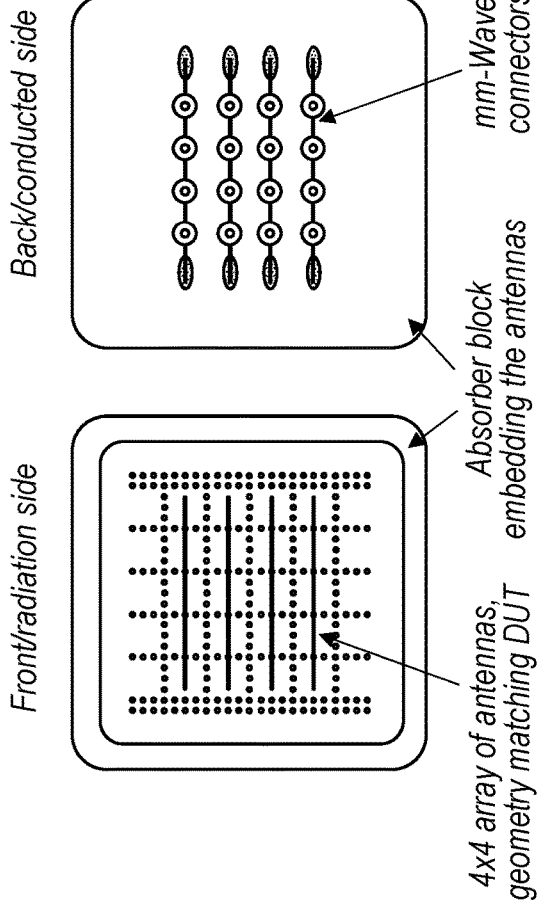
FIG. 7 shows front and back of an example embodiment of the PAS, according to some embodiments.

FIG. 6 illustrates an embodiment of the Probe Antenna System (PAS) positioned above (or mounted above) a DUT. FIG. 7 shows an embodiment of the PAS, where the left side of FIG. 7 shows the bottom of the PAS and the right side of FIG. 7 shows the top of the PAS. In this embodiment, the PAS comprises a plurality (e.g., 16) probe antenna elements with SMPM RF connectors embedded into a solid RF absorbing material. The PAS may be configured to transmit simultaneously or receive simultaneously with a subset or all of its probe antenna elements.

Simultaneously processing a large number of channels in a conventional mmWave measurement instrumentation may be prohibitively costly in some deployments. To address these and other concerns, in some embodiments an active PAS may be used that includes the RF up- and down-converters close to the probe antennas. This may allow use of an IF backend system that is less costly, enabling parallel units to be used at a manageable cost. Furthermore, measurement uncertainty and reliability may be improved as the IF connections between the probe array and the instrumentation is less sensitive to movements etc. A picture of the active PAS device is shown in FIGS. 8A-C. As illustrated, FIG. 8A shows an example circuit layout for a single printed circuit board (PCB), FIG. 8B shows a combination of four stacked PCBs where adjacent PCBs are rotated 180° relative to each other, and FIG. 8C illustrates an antenna socket. Advantageously, the mirrored design of the stacked PCB configuration may improve isolation of the probe antennas.

Figure 9:
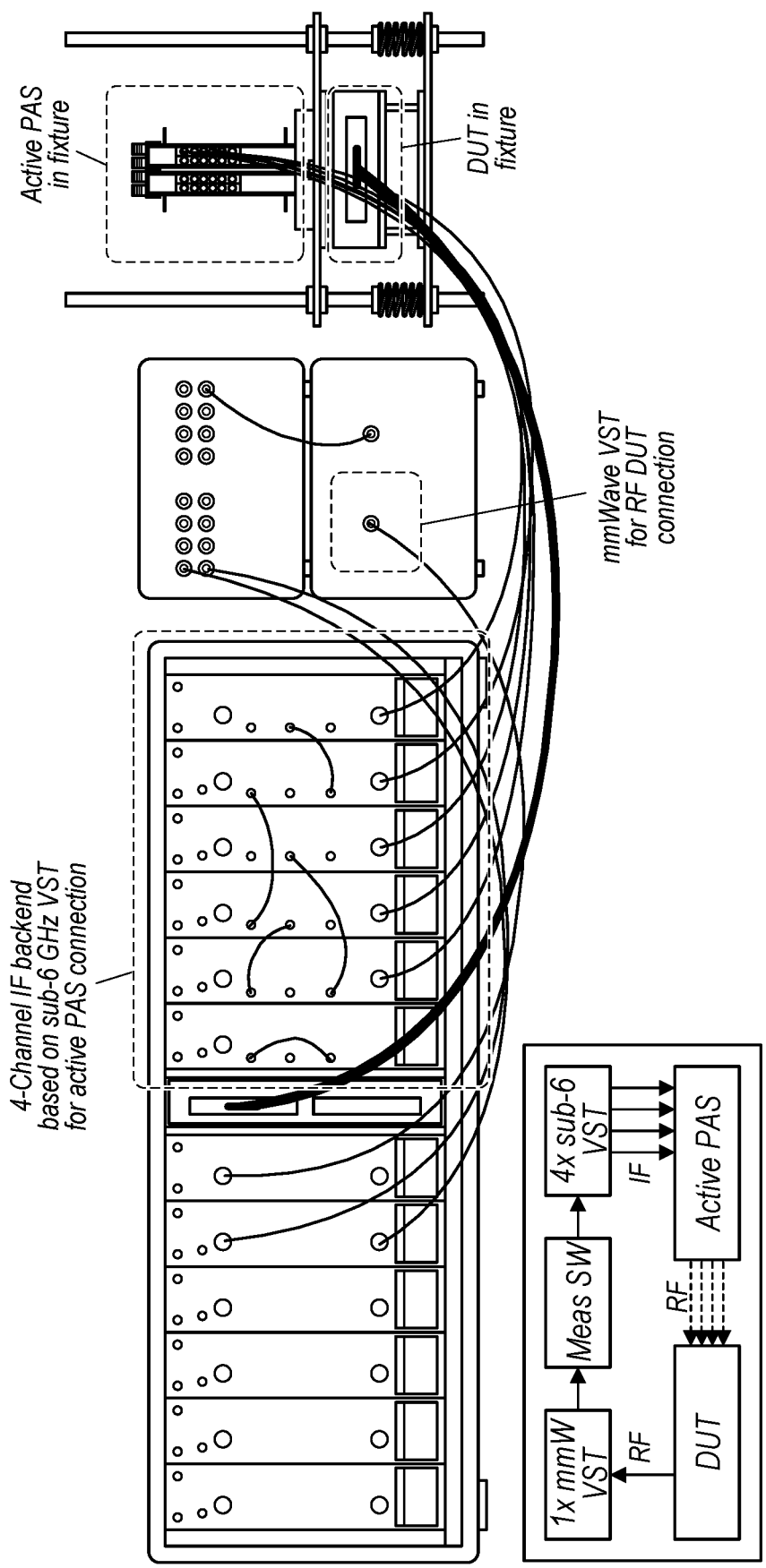
FIG. 9 illustrates a validation setup for active PAS, according to some embodiments.

FIG. 9 illustrates a 4-channel active PAS validation setup usable for the DUT Rx measurements, according to some embodiments. As illustrated, a National Instruments (NI) Vector Signal Transceiver (VST) platform is utilized where one mmWave VST is used for the connection to the RF-RF DUT as well as four sub-6 GHz VSTs for the IF backend system.

As shown in FIG. 6, the PAS may be placed above the DUT in such a way that each antenna in the PAS is above a respective or corresponding DUT antenna element, and hence each antenna in the DUT is configured to measure electromagnetic signals generated by its respective or corresponding PAS antenna element.

Figure 10:
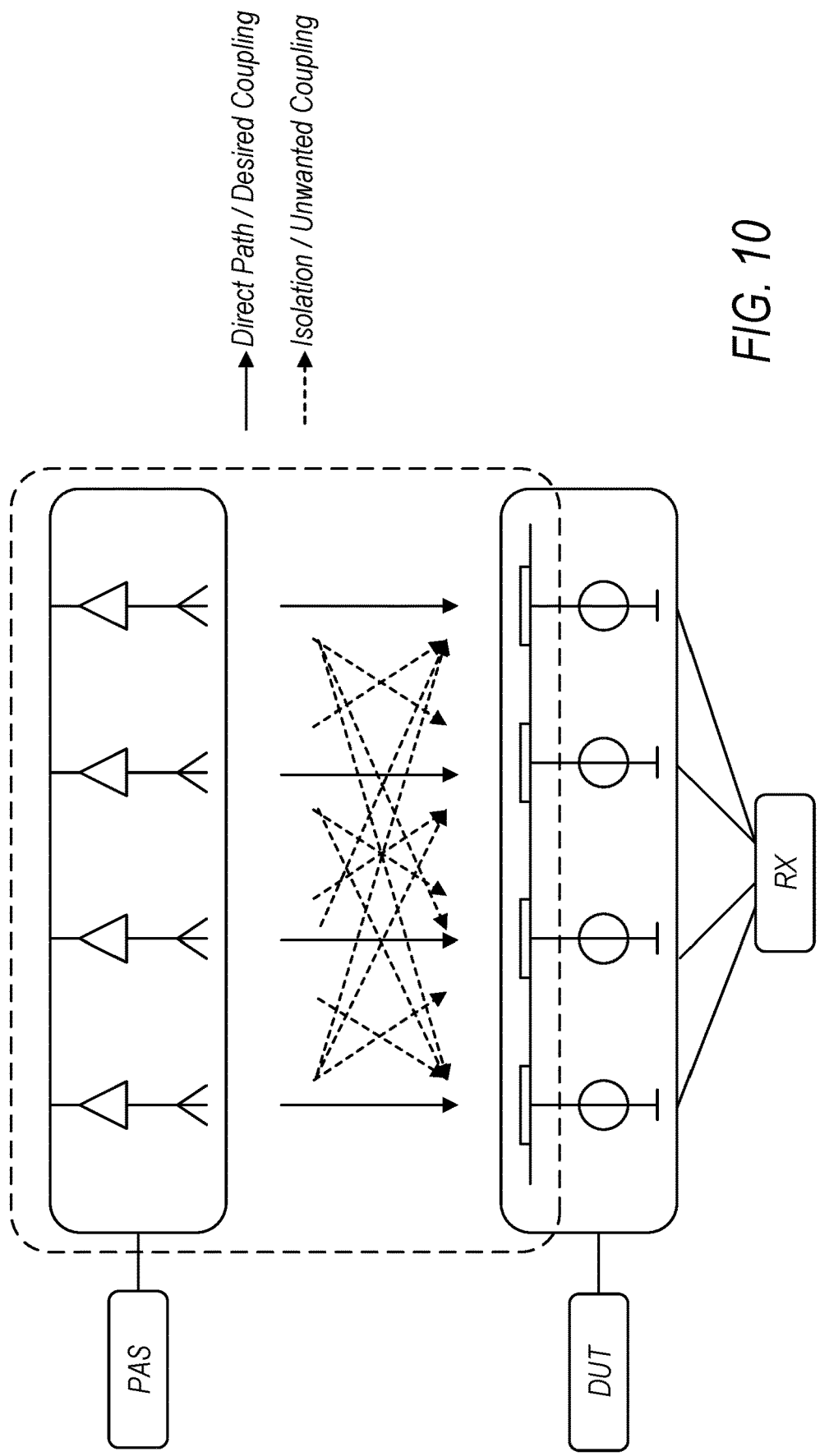
FIG. 10 illustrates various types of couplings between the PAS and the DUT, according to some embodiments.

FIG. 10 illustrates the direct path and the unwanted coupling of transmissions between the DUT and the PAS. As shown, the direct path represents a desired coupling of electromagnetic signals between the PAS and the DUT, and the "isolation" represents unwanted coupling of electromagnetic signals between the PAS and the DUT. Thus, as shown, it is desired for each antenna element in the DUT to receive a signal from its corresponding antenna on the PAS, while minimizing interference from other non-corresponding antennas on the PAS.

To aid the isolation between adjacent antennas and avoid reflections of the transmitted signal from the PAS the DUT antennas may be surrounded by an absorbing material.

Different embodiments may use various antenna structures in the PAS to improve performance against the design criteria. Such antenna structures include, e.g.;

1. Yagi antennas may help with high directivity towards the opposite DUT antenna element but the metallic directors may increase coupling between the adjacent probe antennas and may add reactive near field disturbance;
2. Antipodal Vivaldi antennas may ease broadband operation with good matching over a large range of frequencies, may reduce adjacent coupling but with large aperture may increase the potential for reflections;

3. Horn antennas may be favored because of very good coupling between DUT antenna element and PAS element and excellent isolation especially with dielectric filling but such filling may create strong reflections off of the PAS element and, thus, unduly alter the DUT impedance.

The PAS antenna elements and the array may be implemented in several ways. In some embodiments, the PAS array may be built from individual antenna elements. In other embodiments, a plurality of antenna elements may be realized as a single module. In one particular embodiment, shown in FIG. 9, four elements are arranged together on a single multi-layer printed circuit board and the entire array is built from four such modules.

Figure 11:
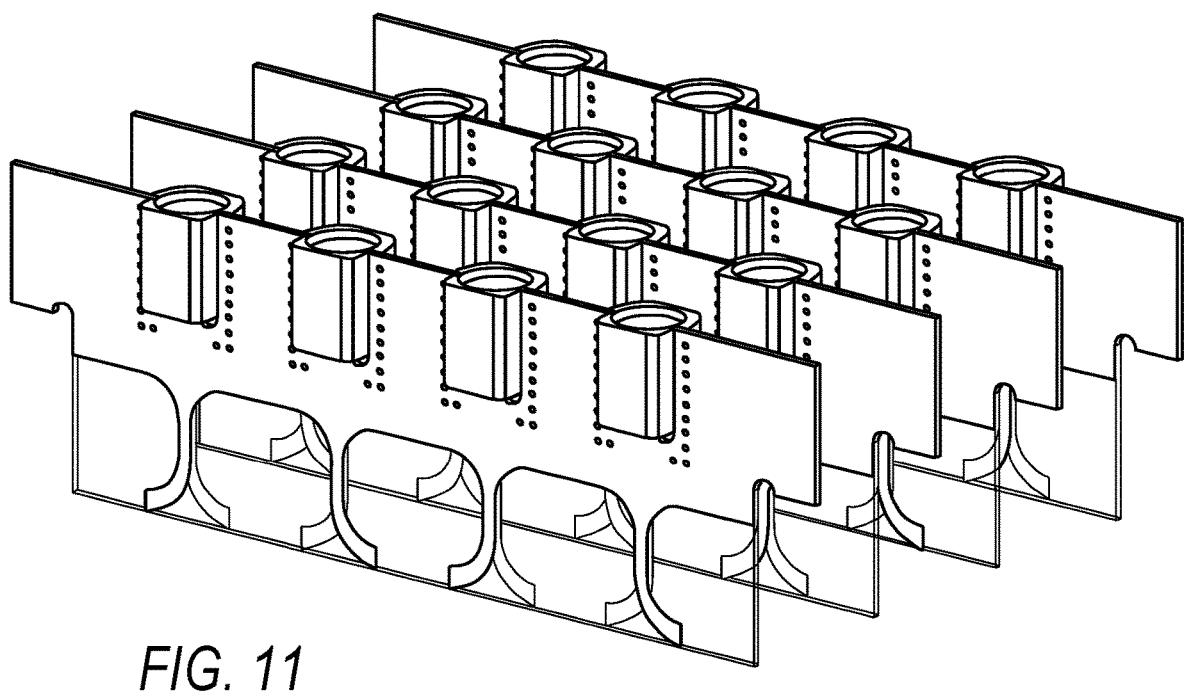
FIG. 11 illustrates a PAS antenna array without an absorbing structure and revealing the periodic mirrored arrangement of the antenna elements, according to some embodiments.

In some embodiments, the PAS comprises antipodal antennas with integrated balun. The antipodal antenna structure may be largely or mostly symmetrical but the balun structure may introduce a slight asymmetry. This may lead to a non-uniform coupling of the unwanted DUT-PAS paths. This non-uniform coupling does not significantly affect operation. As shown in FIG. 11, in some embodiments the PAS design includes a periodical mirrored arrangement of the antenna which may resolve this issue.

The design of the absorbing structure between the PAS antennas may incorporate an absorbing material that implements a trade-off between inter-PAS-element isolation and (dielectric) loading of the DUT antennas. Too little absorbing material may lead to insufficient isolation between the PAS antenna elements. Too much absorbing material changes the impedance of the DUT antenna above the given limit. The shape of the absorbing material is important as well as the volume. To achieve good absorption behavior and thus minimize the reflected energy, the PAS design may include a large surface with less parallel and/or 90° corners with respect to the direction of the energy flux of the electromagnetic radiation.

In one embodiment, the PAS antennas could be cast directly into the absorbing structure. Direct casting of the antennas into the absorbing structure may simplify the manufacturing. However direct contact of the absorbing material with the RF transmission lines connecting the PAS antenna elements may increase losses on these transmission lines, especially with microstrip transmission lines.

If this is undesirable, another embodiment may leave some small absorber-free region in the absorber structure around and close to the RF transmission lines.

Figure 12:
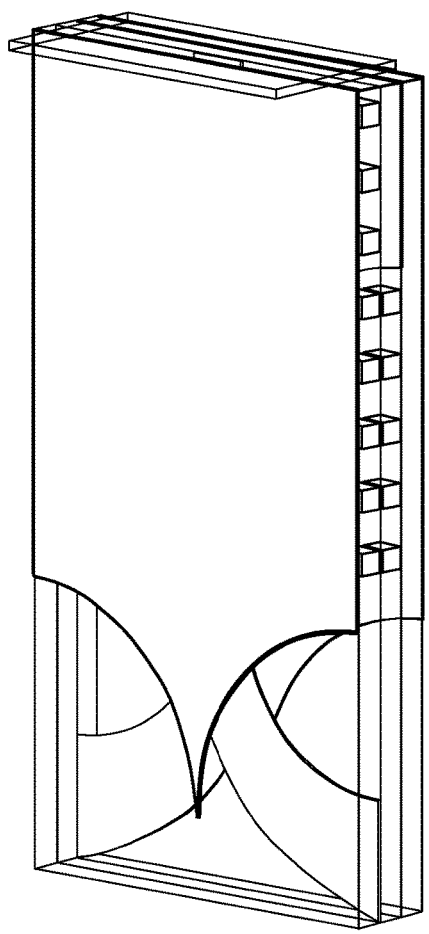
FIG. 12 illustrates an antipodal antenna of the PAS with stripline feeding, according to some embodiments.

Still other embodiments may optimize RF transmission line losses in various other ways. One example may be to use stripline transmission lines, as shown in FIG. 12, which may prevent the electromagnetic field from penetrating the absorbing material.

Near-Field to Far-Field Emulation for DUT Rx Mode

Embodiments herein describe systems and methods to perform DUT receive (Rx) measurements using a PAS operating in transmit mode in the near-field (NF) of the DUT. Prior to performing DUT Rx measurements, a calibration process is performed to calculate calibration coefficients usable by the PAS to emulate a far-field (FF) transmission while transmitting from a NF location.

In some embodiments, during the calibration process, a single probe signal is transmitted to the DUT from a FF location, and this signal is processed with a plurality of different DUT beamforming weights for the different DUT antenna elements. Second, the PAS provides an array of transmissions from a NF location to respective antenna elements of the DUT. The calibration coefficients are determined based on the output signals the DUT provides from both the FF single probe and the NF array probe transmissions. After the calibration process is complete, the calibration coefficients may be used to cause the PAS to provide NF array transmissions that emulate FF single probe or multi-probe transmissions, to cheaply and rapidly test and measure Rx capabilities for a plurality of DUTs. Advantageously testing and measurement procedures may be performed without the expense of a large anechoic chamber to house the DUT and a probe antenna separated by a far-field distance.

The NF transmission may be performed with a multi-probe device where each probe of the multi-probe device transmits in the near-field (e.g., the radiating or reactive NF) to a single-element antenna of a DUT Rx antenna array. Advantageously, the one-to-one mapping of transmitters to receivers may allow for very small measurement distances. In some embodiments, the far-field to near-field mapping coefficients are calculated in a calibration step (explained below in more detail), exploiting the linearity between far-field and near-field behavior. The near-field transmit signals may be calculated based on the mapping coefficients and single-antenna element far-field patterns of the DUT Rx antenna array for a certain direction (i.e., far-field/near-field scaling). The single-antenna element FF patterns may be measured in a conventional chamber and assumed to be available.

The signal at the connector output of the DUT may be measured, and the result may be compared to the outcome of a measurement with one or more far-field radiating sources. Measurements may be repeated for all directions in the far-field to obtain the gain pattern for the complete spherical shell (or a desired portion thereof) around the DUT. Recalibration may be performed for different power levels in case of nonlinearities with power level. The following sections describe the PAS DUT Rx measurement procedure in more detail.

Figure 13:
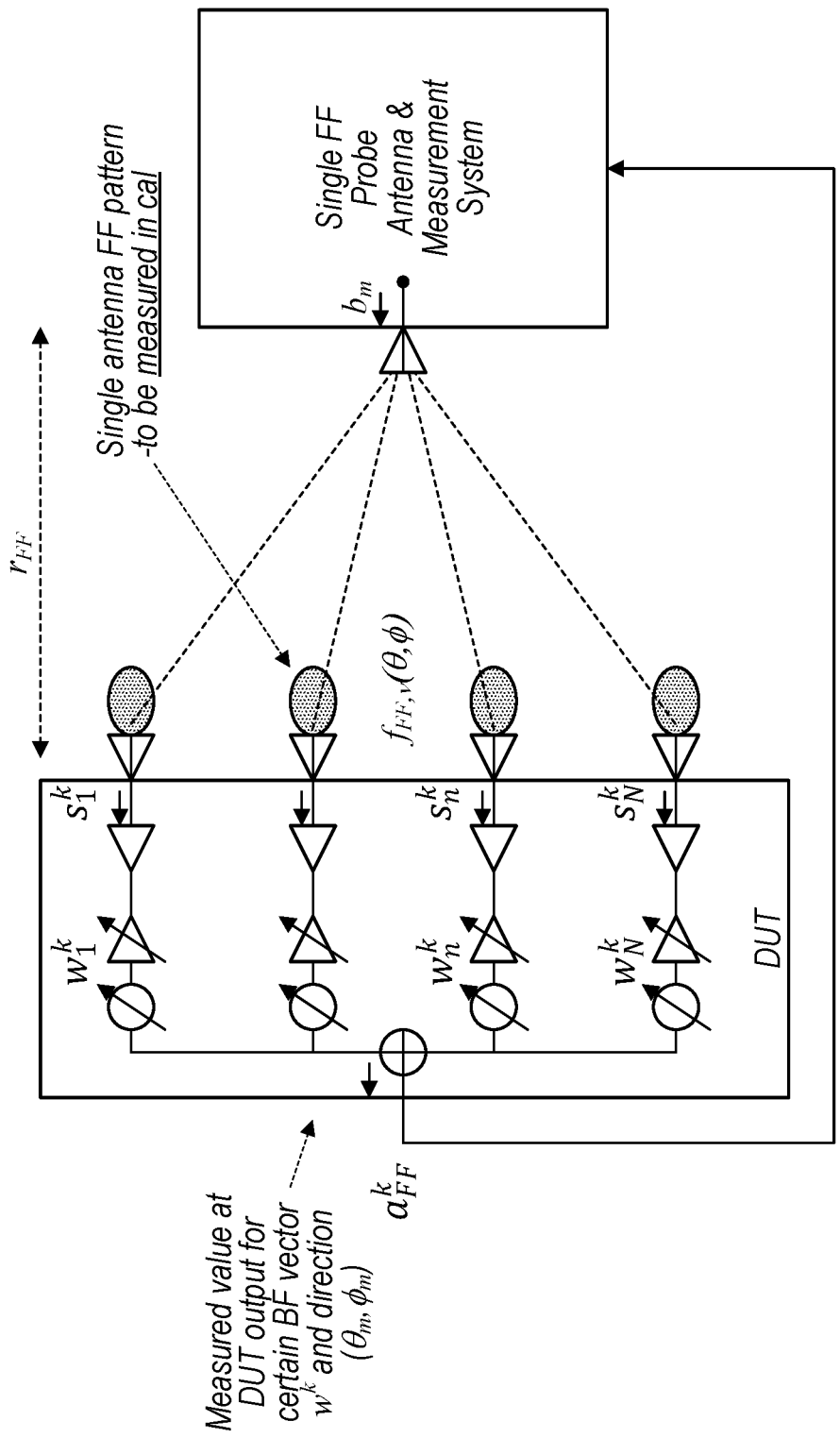
FIG. 13 is a schematic illustration of a single far-field probe antenna transmitting to a DUT in a calibration step, according to some embodiments.

FIG. 13—Far-Field Measurement Setup with Probe Antenna

FIG. 13 is a schematic illustration of a far-field (FF) measurement setup with a single FF probe antenna and a DUT in Rx mode, according to some embodiments. As illustrated, a signal $b_m$ is generated by the measurement system and transmitted from a probe antenna at a sufficiently large far-field distance $r_{FF}$ at a certain location $(\theta_m, \phi_m)$. The FF probe generates an incident wave to the DUT antenna and couples with each DUT antenna element n in a different way resulting in different E-field patterns per element $f_{FF,n}(\theta_m, \phi_m)$. The beamforming chip may be configured in different ways to measure these induced signals with a certain beamforming weight whereas $w_n^k$ represents the weight for the n-th element with k as the beamforming vector index. All received signals are summed up to obtain the DUT FF output signal $a_{FF}^k$ that may be measured by the measurement system. For a specific beamforming vector $w^k$ and position $(\theta_m, \phi_m)$ the FF output signal can be stated as:

$$a_{FF}(w^k, \theta_m, \phi_m) = \Sigma_n c_n^k (w_n^k) f_{FF,n}(\theta_m, \phi_m) b_m = c^k(w^k)^T s$$
$$(\theta_m, \phi_m) = c^k(w^k)^T f_{FF}(\theta_m, \phi_m) b_m$$

Note that throughout this specification, lower-case non-bold italicized letters are used to denote individual (scalar) quantities, lower-case bold italicized letters (e.g., $w_n^k$) are used to denote vectors (e.g., $w^k$), and upper-case bold italicized letters are used to denote matrices (e.g., W).

Based on the known transmit signal and the measured receive signal the measurement instrument may calculate metrics of interest such as a gain pattern or error vector magnitude (EVM). For example, the single element E-field pattern for different directions ($\theta_m$, $\phi_m$) may be estimated by:

$$f_{FF,n}(\theta_m,\phi_m)=(a_{FF}(w^0,\theta_m,\phi_m)/b_m-i)/c_n^0(w^0)$$

where it is utilized that one specific DUT antenna branch n may be switched on while the other antenna branches are switched off. If no perfect muting for all but the single DUT element n is possible, an interference pattern i may be measured and included in the calibration measurement.

When measuring the DUT output for a set of beamforming vectors W={$w^0$, $w^k$ ... $w^K$} one may stack the measured DUT output values in a vector and state:

$$a_{FF}(W,\theta_m,\phi_m)=C(W)f_{FF}(\theta_m,\phi_m)b_m$$

A diagonal matrix W would indicate that the output signals are measured for each antenna branch individually.

Figure 14:
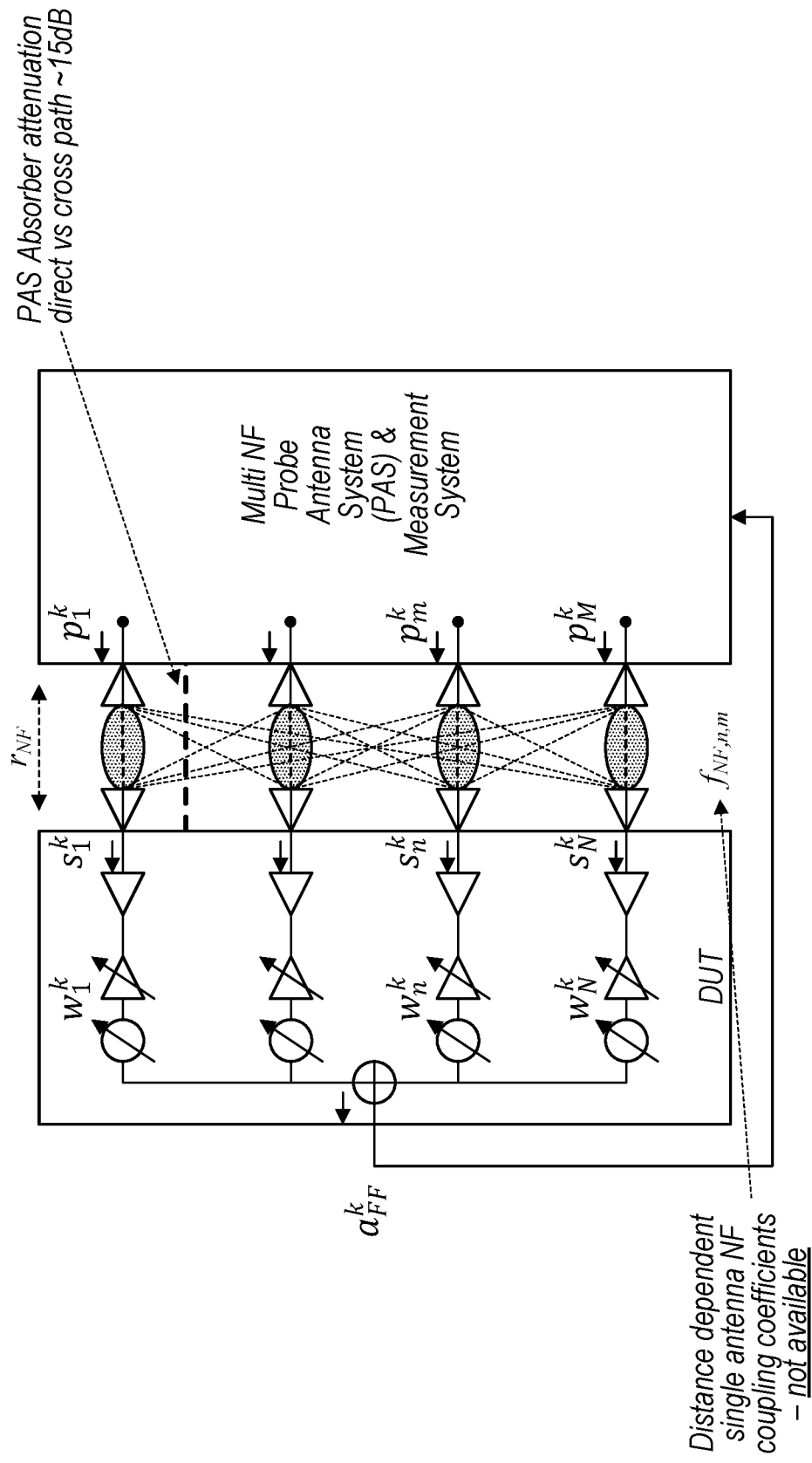
FIG. 14 is a schematic illustration of a multi-probe near-field antenna array transmitting to a DUT in a calibration step, according to some embodiments.

FIG. 14—Near-Field Measurement Setup with PAS

FIG. 14 is a schematic illustration of a near-field measurement setup with a PAS and a DUT in Rx mode. The near-field DUT output signal may be quantified as:

$$a_{NF}(w^k)=\Sigma_n c_n^k(w_n^k)s_n=c^k(w^k)^T s=\Sigma_n c_n^k(w_n^k)$$
$$\Sigma_m f_{NF,n,m} p_m = c^k(w^k)^T F_{NF} p$$

In exemplary embodiments, the near-field measurement is repeated for different beamforming vectors W={$w^0$, $w^k$ ... $w^K$} and an DUT output vector may be obtained with the following relations:

$$a_{NF}(W)=C(W)F_{NF}p=R\ p$$

The goal for the proposed new near-field to far-field mapping procedure is to generate with the PAS signals an output signal $a_{NF}^k$ that approximates the far-field equivalent $a_{FF}^k$. With that one may derive:

$$a_{FF}(W,\theta_m,\phi_m)=R\ p(\theta_m,\phi_m)$$

which may be reformulated as:

$$p(\theta_m,\phi_m) = R^{-1}a_{FF}(W,\theta_m,\phi_m) = F_{NF}^{-1}C(W)^{-1}a_{FF}(W,\theta_m,\phi_m) =$$
$$F_{NF}^{-1}C(W)^{-1}C(W)f_{FF}(\theta_m,\phi_m)b_m = F_{NF}^{-1}f_{FF}(\theta_m,\phi_m)b_m$$

In some embodiments, a PAS transmit signal vector p may be created based on a mapping matrix $R^{-1}$. This is similar to pre-coding of transmit signals to pre-compensate the channel coupling. Furthermore, as the signals in the DUT are summed up for the DUT output signal, all PAS signals $p_m^k$ may be transmitted simultaneously. It should be also noted that for emulating a certain direction of arrival ($\theta_m$, $\phi_m$), a specific PAS vector $p(\theta_m, \phi_m)$ may be generated. The near-field PAS transmit vector $p(\theta_m, \phi_m)$ is a scaled version of the single-element antenna E-field values for a certain direction $f_{FF,n}(\theta_m, \phi_m)$ stacked into the vector $f_{FF}(\theta_m, \phi_m)$. Advantageously, transmissions from multiple antennas may be simulated by superposition.

In some embodiments, it may be assumed that the DUT output signals for near-field and far-field excitations are calibrated with the same beamforming vectors (W) applied for both the near-field and far-field measurements, so that the matrices C(W) that describe the beamformer behavior cancel out. This may be advantageous if the estimation of the C values is difficult. However, it assumes that the DUT for all signals going through the DUT and recombining in the DUT is in a linear mode of operation.

In some embodiments, the matrix R may be estimated in a calibration step. In one embodiment, an orthogonal set of PAS transmit vectors is defined stacked into a matrix P and the DUT output is calculated for all beamforming vectors W so that:

$$A_{NF}(W,P)=R\ P$$

$$R=A_{NF}(W,P)P^{-1}$$

It may be desirable that the matrix P is invertible, so that the second expression is well defined. One specific option may be to mute all PAS transmit antennas except one (if feasible) and calculate the mapping matrix iteratively:

$$a_{NF}(W)=r_m p_m$$

$$r_m=a_{NF}(W)/p_m$$

Alternatively, in some embodiments the PAS signals $p_m$ are generated such that the signals after the antenna $s_n$ (see FIG. 14) are equal to the signals in a corresponding far-field measurement. This may leave options to obtain the matrix C(W) using alternative (iterative) estimation techniques. The corresponding base equation would be:

$$F_{NF}p=f_{FF}(\theta_m,\phi_m)b_m$$

Which leads to the expression already derived before:

$$p(\theta_m,\phi_m)=F_{NF}^{-1}f_{FF}(\theta_m,\phi_m)b_m$$

Advantageously, the near-field coupling matrix $F_{NF}$ may be estimated directly. This may be done using similar techniques as described above, e.g. using the iterative method such that:

$$a_{NF,m}(W)=C(W)f_{NF,m}p_m$$

$$f_{NF,m}=C(W)^{-1}a_{NF,m}(W)/p_m$$

whereas one may again estimate one column of the matrix $F_{NF}$ related to the corresponding probe antenna/signal $p_m$. The matrix $C(W)^{-1}$ may be obtained utilizing the far-field measurement setup as shown in FIG. 11, whereas the matrix coefficients may be estimated by:

$$c_n^k(w_n^k)=(a_{FF}(w^k,\theta_0,\phi_0)/b_0-i)/f_{FF,n}(\theta_0,\phi_0)$$

$$c_n^k(w_n^k)=(a_{FF}(w^k,\theta_0,\phi_0)/b_0-i)/(a_{FF}(w^0,\theta_m,\phi_m)/b_m-i)/c_n^0(w^0))$$

where it is utilized that one specific DUT antenna branch n may be switched on while the other antenna branches may be switched off. If perfect muting is not achievable, an interference pattern i may be measured and included in the calibration measurement.

Figure 15:
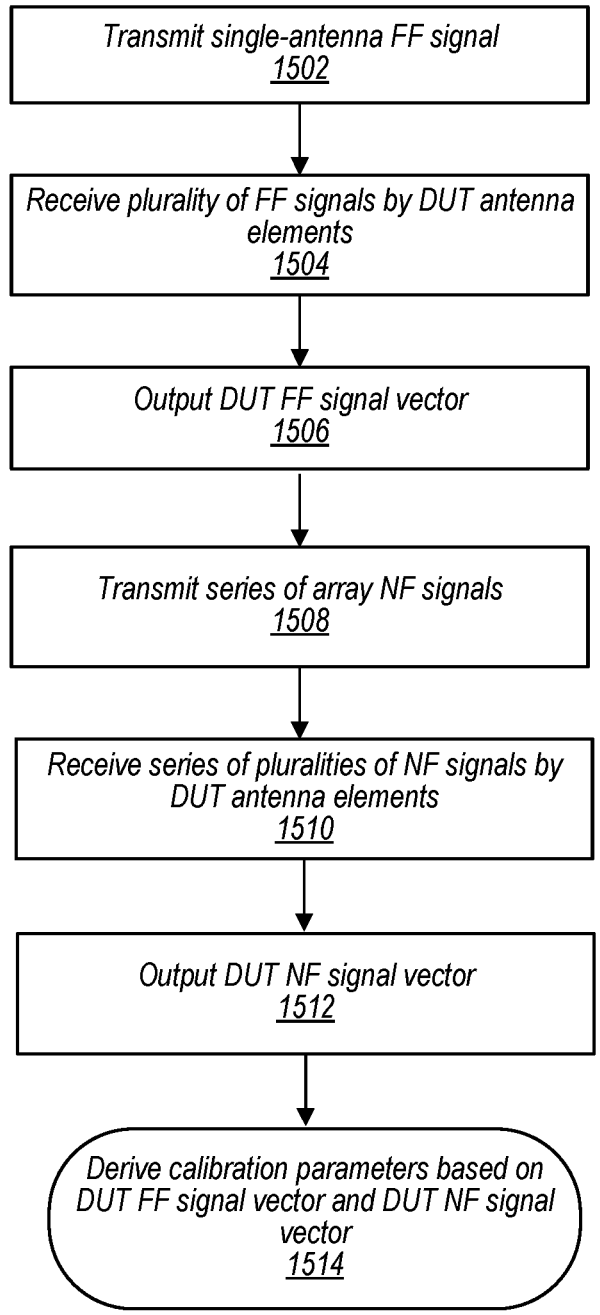
FIG. 15 is a flowchart diagram illustrating a method for deriving calibration parameters to emulate a far-field signal from a near-field location, according to some embodiments.

FIG. 15—Flowchart—Calculation of NF-to-FF Calibration Coefficients

FIG. 15 is a flowchart diagram illustrating a method for determining NF-to-FF calibration coefficients usable by an array transmitter to emulate a single antenna FF transmission from a NF location, according to some embodiments. While the methods are described in the context of emulating a single antenna FF transmission from a NF location, it may be understood that the described methods may also be used emulate the single antenna FF transmission from another FF location, a mid-field location, or either a reactive or radiating NF location. Determining the calibration coefficients may be performed using a first DUT during a calibration procedure, and the obtained calibration coefficients may be subsequently utilized to perform testing/measurement procedures on other DUTs. The method shown in FIG. 15 may be used in conjunction with any of the computer systems, memory media or devices shown in the above Figures, among other devices. In various embodiments, some of the method elements shown may be performed concurrently, in a different order than shown, or may be omitted. Additional method elements may also be performed as desired. As shown, this method may operate as follows.

At 1502, a series of first transmissions is transmitted to an antenna array of a DUT from a first far-field (FF) location. The series of first transmissions may be transmitted by a single antenna element from the FF location. The series of first transmissions may be performed in an anechoic chamber containing both the transmitter and the DUT, in some embodiments. The antenna array may include a plurality of DUT Rx antenna elements configured to receive the series of first transmissions.

In some embodiments, one or more series of second transmissions are additionally transmitted to the antenna array of the DUT from one or more respective second FF locations. The second transmissions may be processed by the DUT and utilized to determine calibration parameters to emulate FF transmissions from a plurality of distinct FF locations.

The first transmissions may be unmodulated single-tone or multi-tone signals, or modulated signals where the modulation process may affect amplitude, frequency, and/or phase of the signals. Furthermore, these wireless signals may be continuous waves or intermittent and may occupy narrow or wide bandwidth.

The radiation of the first transmissions may be single-polarized or dual-polarized. Some embodiments may determine DUT FF output signals and calibration parameters for one polarization or per polarization to emulate the FF pattern for one polarization or per polarization. Polarizations may be measured in parallel using a single spatial sweep with a dual-polarized probe antenna.

At 1504, each of the plurality of DUT antenna elements receive a respective FF signal produced by the series of first transmissions. For example, the DUT antenna elements may be configured in an array, and each antenna element may receive a respective channel modified version of the transmitted signal, as shown in FIG. 13.

In some embodiments, the received FF signals are radio frequency (RF) signals, and the DUT is configured to down-convert the received FF signals from the RF range to an intermediate frequency (IF) range while producing the DUT FF output signal vector. Phase information of the received FF signals may facilitate the down-conversion process. Alternatively, the received FF signals may be down-converted to a direct digital data stream for output.

At 1506, a DUT FF output signal vector $a_{FF}$ is stored. The DUT FF output signal vector includes a plurality of DUT FF output signals, and each DUT FF output signal is produced by the DUT based on a summation of the FF signals received by the plurality of DUT antenna elements. For example, as shown in FIG. 13, for each first transmission, the processed signals received by each of the antenna elements may be combined to form a single DUT FF output signal, $a_{FF}^k$. The DUT FF output signals may specify measurements of amplitude and phase of electromagnetic fields generated by the plurality of antenna elements for one or more frequencies.

In some embodiments, each DUT FF output signal of the DUT FF output signal vector corresponds to a distinct set of beamforming weights $w_n^k$ of the plurality of DUT antenna elements. The summation that produces each DUT FF output signal of the DUT FF output signal vector may be weighted according to a respective distinct set of beamforming weights. In other words, for each DUT FF output signal, the summation of the FF signals received by each of the plurality of DUT antenna elements may be weighted for each DUT antenna element according to a distinct respective set of beamforming weights of the DUT antenna elements. The superscript "k" in the quantity $a_{FF}^k$ is an index for the distinct sets of beamforming weights, and the boldface vector $a_{FF}$ includes an element for each of a plurality of distinct sets of beamforming weights. In some embodiments, each set of beamforming weights corresponds to gain and phase settings applied to the received FF signals for each of the plurality of DUT antenna elements. In some embodiments, the set of beamforming weights are configured for the plurality of DUT antenna elements by applying a plurality of different beamformer settings on each one of the plurality of DUT antenna elements.

A different beamformer setting may be applied during reception of each first transmission of the series of first transmissions. The different beamformer settings may be orthogonal to each other in the sense that a dot product of representations of first and second beamformer settings as respective vectors may yield zero, where each entry in the beamformer setting vector corresponds to beamformer weights of each antenna element in the DUT antenna array. The beamformer settings may be orthogonal by individually turning on a distinct antenna element for each beamformer setting, or alternatively orthogonal codes may be used to obtain orthogonal beamformer settings.

At 1508, a series of array transmissions are transmitted to the antenna array from a second location, for example, using the setup illustrated in FIG. 14. The second location may be a near-field (NF) region or a second FF location, in various embodiments. Each of the array transmissions in the series includes a plurality of second signals transmitted by respective antenna elements of a transmitter device. In some embodiments, the series of array transmissions are transmitted by a probe antenna system (PAS) having a plurality of PAS antenna elements, or they may be transmitted by another type of device that includes an array of transmitter antenna elements. The plurality of PAS elements may be equal to or greater than the plurality of DUT antenna elements. The second signals may be directed toward distinct DUT antenna elements of the plurality of DUT antenna elements. In other words, for a given array transmission of the series of array transmission, each of the second signals may be transmitted by a respective PAS antenna element and may be preferentially targeted toward a different Rx antenna element of the DUT. Alternatively, each of the second signals may be received by multiple Tx antenna elements of the DUT.

In some embodiments, the array transmissions of the series of array transmissions are mutually orthogonal. In other words, the array transmissions may be selected such that when a first array transmission is represented as a vector with an entry for the transmission power of each antenna in the array, a dot product of the first array transmission vector with another array transmission vector in the series will be zero.

The NF wireless signals generated by the PAS for which the calibration parameters may be determined may be unmodulated single-tone or multi-tone signals, or modulated signals where the modulation process may affect amplitude, frequency, and/or phase of the signals. Furthermore, these wireless signals may be continuous waves or intermittent and may occupy narrow or wide bandwidth.

The radiation of the wireless signals generated by the PAS may be single-polarized or dual-polarized. Some embodiments may determine DUT NF output signals and calibration parameters for one polarization or per polarization to emulate the FF pattern for one polarization or per polarization. Polarizations may be measured in parallel using a single spatial sweep with a dual-polarized probe antenna.

At 1510 each of the plurality of DUT antenna elements receives a series of respective NF signals produced by the series of array transmissions.

In some embodiments, the received NF signals are radio frequency (RF) signals, and the DUT is configured to down-convert the received NF signals from the RF range to an intermediate frequency (IF) range while producing the DUT NF output signal vector. Phase information of the received NF signals may facilitate the down-conversion process. Alternatively, the received FF signals may be down-converted to a direct digital data stream for output At 1512, in response to receiving the series of NF signals, the DUT may output a DUT NF output signal vector $a_{NF}$. The DUT NF output signal vector may include a DUT NF output signal for each of a plurality of sets of beamforming weights k, and the sets of beamforming weights may be the same as was used in generating the DUT FF output signal vector. In other words, for each DUT NF output signal, a weighted summation may be performed over the NF signals received by each of the DUT antenna elements, where the summation is weighted based on the same set of beamforming weights as was used to produce the respective DUT FF output signal.

At 1514, a set of calibration parameters are derived based at least in part on the DUT FF output signal vector and the DUT NF output signal vector. The set of calibration parameters are useable to generate an array transmission that emulates an FF transmission from the first FF location. In other words, the set of calibration parameters may be used to generate and transmit an array transmission that emulates the FF transmission from the first FF location to one or more second DUTs.

In some embodiments, steps 1502-1506 and 1514 may be repeated for a plurality of different FF locations and/or with a plurality of additional antennas. For example, a single-antenna FF transmission may be sent from a plurality of different locations or a multi-antenna FF transmission may be sent from locations within a FF region, and each FF transmission may be used to derive a respective set of calibration parameters. Accordingly, part or all of FF region surrounding the DUT may be emulated using the different sets of calibration parameters, at any desired resolution (i.e., the distance separating different FF locations may be selected based on the desired testing resolution of the DUT). In more detail, one or more series of second transmissions to the antenna array may be performed from one or more additional respective FF locations, each of the plurality of DUT antenna elements may receive second respective FF signals produced by the one or more series of second transmissions, and one or more second DUT FF output signal vectors may be stored which are produced based on the second received FF signals. One or more additional sets of calibration parameters may then be derived based at least in part on the one or more second DUT FF output signal vectors and the DUT NF output signal vector. The one or more additional sets of calibration parameters may be useable to generate one or more respective NF array transmissions that emulate one or more respective FF transmissions from the one or more second FF locations.

Alternatively or additionally, the one or more additional sets of calibration parameters may be used to emulate a multi-antenna FF transmission. For example, the set of calibration parameters and the one or more additional sets of calibration parameters may be superimposed to simulate a multi-antenna FF transmission, in some embodiments. In other words, a single NF array transmission may utilize the sets of calibration parameters to emulate a plurality of simultaneous FF transmissions from different FF locations.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A system for emulating a far-field (FF) transmission with an array of transmitters, the system comprising:
   a non-transitory computer-readable memory medium;
   a processor coupled to the memory medium;
   a device-under-test (DUT), wherein the DUT includes an antenna array comprising a plurality of DUT antenna elements; and
   an antenna system comprising a plurality of antenna elements, wherein the system is configured to:
      receive, by each of the plurality of DUT antenna elements, respective first signals produced by a series of first transmissions transmitted from a first FF location;
      store a first DUT output signal vector in the memory medium, wherein the first DUT output signal vector comprises a plurality of first DUT output signals, wherein each of the first DUT output signals is produced by the DUT based on a summation of the first signals received by the plurality of DUT antenna elements, wherein each first DUT output signal of the first DUT output signal vector corresponds to a distinct set of beamforming weights of the plurality of DUT antenna elements;
      perform a series of array transmissions to the antenna array using the antenna system from a second location, wherein each array transmission of the series of array transmissions comprises a plurality of second transmissions, wherein the second transmissions are directed toward DUT antenna elements of the plurality of DUT antenna elements;
      receive, by each of the plurality of DUT antenna elements, a series of respective second signals produced by the series of array transmissions;
      store a second DUT output signal vector in the memory medium, wherein the second DUT output signal vector comprises a plurality of second DUT output signals, wherein each of the second DUT output signals is produced by the DUT based on a summation of the second signals received by the plurality of DUT antenna elements;
   derive a set of calibration parameters based at least in part on the first DUT output signal vector and the second DUT output signal vector, wherein the set of calibration parameters are useable to generate an array transmission that emulates an FF transmission from the first FF location; and
   store the set of calibration parameters in the memory medium.

2. The system of claim 1, wherein the system is further configured to:
   perform one or more series of second transmissions to the antenna array from one or more second respective FF locations;
   receive, by each of the plurality of DUT antenna elements, second respective FF signals produced by the one or more series of second transmissions;

store one or more additional DUT FF output signal vectors produced based on the second received FF signals;

derive one or more second sets of calibration parameters based at least in part on the one or more additional DUT FF output signal vectors and the received series of respective second signals, wherein the one or more second sets of calibration parameters are useable to generate one or more respective second array transmissions that emulate one or more respective FF transmissions from the one or more second FF locations.

3. The system of claim 2,
wherein the array transmission and the one or more second array transmissions emulate a multi-antenna transmission from the first and second FF locations.

4. The system of claim 1,
wherein a total number of the plurality of antenna elements is equal to or greater than a total number of the plurality of DUT antenna elements.

5. The system of claim 1,
wherein the sets of beamforming weights correspond to gain and phase settings applied to the received first signals for each of the plurality of DUT antenna elements, and
wherein the sets of beamforming weights are mutually orthogonal.

6. The system of claim 1,
wherein the sets of beamforming weights are configured for the plurality of DUT antenna elements by applying a plurality of different beamformer settings on each one of the plurality of DUT antenna elements.

7. The system of claim 1, wherein the system is further configured to:
utilize the set of calibration parameters to generate and transmit the array transmission that emulates the FF transmission from the first FF location to one or more second DUTs.

8. The system of claim 1,
wherein the second DUT output signals correspond to the same distinct sets of beamforming weights of the plurality of DUT antenna elements as the DUT FF output signals, and
wherein the summation of the first signals received by the plurality of DUT antenna elements and the summation of the second signals received by the plurality of DUT antenna elements are weighted based on the distinct sets of beamforming weights.

9. The system of claim 1,
wherein a number of first transmissions in the series of first transmissions is equal to or greater than a total number of the plurality of DUT antenna elements.

10. The system of claim 1,
wherein different sets of beamforming weights are used for different first transmissions of the series of first transmissions.

11. The system of claim 1,
wherein the second location comprises a near-field (NF), mid-field, or FF location.

12. The system of claim 1,
wherein the antenna system comprises a probe antenna system (PAS).

13. The system of claim 1,
wherein the array transmissions of the series of array transmissions are mutually orthogonal.

14. The system of claim 1, wherein the system is further configured to:
derive the set of calibration parameters for each of a plurality of different polarizations.

15. A method for calibrating a testing procedure for a device under test (DUT), wherein the DUT includes an antenna array comprising a plurality of DUT antenna elements, the method comprising:
performing a series of first transmissions to the antenna array from a first far-field (FF) location;
receiving, by each of the plurality of DUT antenna elements, respective first signals produced by the series of first transmissions;
storing a first DUT output signal vector, wherein the first DUT output signal vector comprises a plurality of first DUT output signals, wherein each of the first DUT output signals is produced by the DUT based on a summation of the first signals received by the plurality of DUT antenna elements, wherein each first DUT output signal of the first DUT output signal vector corresponds to a distinct set of beamforming weights of the plurality of DUT antenna elements;
performing a series of array transmissions to the antenna array from a second location, wherein each array transmission of the series of array transmissions comprises a plurality of second transmissions, wherein the second transmissions are directed toward DUT antenna elements of the plurality of DUT antenna elements;
receiving, by each of the plurality of DUT antenna elements, a series of respective second signals produced by the series of array transmissions;
storing a second DUT output signal vector, wherein the second DUT output signal vector comprises a plurality of second DUT output signals, wherein each of the second DUT output signals is produced by the DUT based on a summation of the second signals received by the plurality of DUT antenna elements;
deriving a set of calibration parameters based at least in part on the first DUT output signal vector and the second DUT output signal vector, wherein the set of calibration parameters are useable to generate an array transmission that emulates an FF transmission from the first FF location.

16. The method of claim 15, the method further comprising:
performing one or more series of second transmissions to the antenna array from one or more second respective FF locations;
receiving, by each of the plurality of DUT antenna elements, second respective FF signals produced by the one or more series of second transmissions;
storing one or more additional DUT FF output signal vectors produced based on the second received FF signals;
deriving one or more second sets of calibration parameters based at least in part on the one or more additional DUT FF output signal vectors and the received series of respective second signals, wherein the one or more second sets of calibration parameters are useable to generate one or more respective second array transmissions that emulate one or more respective FF transmissions from the one or more second FF locations.

17. The method of claim 16,
wherein the array transmission and the one or more second array transmissions emulate a multi-antenna transmission from the first and second FF locations.

18. The method of claim 15, the method further comprising:
deriving the set of calibration parameters for each of a plurality of different polarizations.

19. The method of claim 15,
wherein the sets of beamforming weights are configured for the plurality of DUT antenna elements by applying a plurality of different beamformer settings on each one of the plurality of DUT antenna elements;
wherein the different beamformer settings correspond to gain and phase settings applied to the received first signals for each of the plurality of DUT antenna elements, and
wherein the sets of beamforming weights are mutually orthogonal.

20. The method of claim 15,
wherein the received first signals and the received second signals comprise radio frequency (RF) signals, wherein the method further comprises:
down-converting the received first signals and the received second signals from the RF signals to intermediate frequency (IF) signals while producing the first DUT output signal vector and the second DUT output signal vector, respectively.

21. The method of claim 15, the method further comprising:
utilizing the set of calibration parameters to generate and transmit the array transmission that emulates the FF transmission from the first FF location to one or more second DUTs.

22. The method of claim 15,
wherein the first signals produced by the series of first transmissions and the second signals produced by the series of array transmissions comprise single-tone or multi-tone transmissions, and
wherein receiving the first signals produced by the series of first transmissions and receiving the second signals produced by the series of array transmissions comprise measuring amplitude and phase of electromagnetic fields of the first and second signals at one or more frequencies of the single tone or multi-tone transmissions.

23. A non-transitory computer-readable memory medium comprising program instructions for calibrating a testing procedure for a device under test (DUT), wherein the DUT includes an antenna array comprising a plurality of DUT antenna elements, wherein the program instructions are executable by a processor to cause a calibration system to:

receive, by each of the plurality of DUT antenna elements, respective first signals produced by a series of first transmissions transmitted from a first FF location;
store a first DUT output signal vector in the memory medium, wherein the first DUT output signal vector comprises a plurality of first DUT output signals, wherein each of the first DUT output signals is produced by the DUT based on a summation of the first signals received by the plurality of DUT antenna elements, wherein each summation of the first signals is weighted by a respective distinct set of beamforming weights of the plurality of DUT antenna elements;
perform a series of array transmissions to the antenna array using an antenna system from a second location, wherein each array transmission of the series of array transmissions comprises a plurality of second transmissions, wherein the second transmissions are directed toward DUT antenna elements of the plurality of DUT antenna elements;
receive, by each of the plurality of DUT antenna elements, a series of respective second signals produced by the series of array transmissions;
store a second DUT output signal vector in the memory medium, wherein the second DUT output signal vector comprises a plurality of second DUT output signals, wherein each of the second DUT output signals is produced by the second DUT based on a summation of the second signals received by the plurality of DUT antenna elements, wherein each summation of the second signals is weighted by the respective distinct set of beamforming weights of the plurality of DUT antenna elements;
derive a set of calibration parameters based at least in part on the first DUT output signal vector and the second DUT output signal vector, wherein the set of calibration parameters are useable to generate an array transmission that emulates an FF transmission from the first FF location; and
store the set of calibration parameters in the memory medium.

24. The memory medium of claim 23, wherein the program instructions are further executable to cause the calibration system to:
utilize the set of calibration parameters to generate and transmit the NF array transmission that emulates the FF transmission from the first FF location to one or more second DUTs.

* * * * *